United States Patent [19]

Hamasaki et al.

[11] Patent Number: 4,780,765
[45] Date of Patent: Oct. 25, 1988

[54] SOLID STATE IMAGE PICK-UP DEVICE

[75] Inventors: Masaharu Hamasaki, Kanagawa; Kikue Ishikawa, Tokyo; Yoshiaki Kagawa, Kanagawa; Tomoyuki Suzuki, Kanagawa; Kazuya Yonemoto, Kanagawa, all of Japan

[73] Assignee: Sony Corporation, Tokyo, Japan

[21] Appl. No.: 25,634

[22] Filed: Mar. 13, 1987

[30] Foreign Application Priority Data

Mar. 19, 1986 [JP] Japan .................................. 61-61785

[51] Int. Cl.⁴ ...................... H04N 3/14; H04N 5/335
[52] U.S. Cl. ......................... 358/213.19; 358/213.24; 357/24
[58] Field of Search ...................... 358/213.15, 213.19, 358/213.23, 213.24; 357/24 LR

[56] References Cited

U.S. PATENT DOCUMENTS 4,593,303 6/1986 Dyck et al. .................... 357/24 LR
4,654,683 3/1987 Anagnostopoulos et al. ....... 357/24 LR Primary Examiner—L. T. Hix
Assistant Examiner—Brian W. Brown
Attorney, Agent, or Firm—Ronald P. Kananen

[57] ABSTRACT

A solid state image pick-up device includes means for cancelling a difference in impedance between photo-sensing areas in a photo-sensitive array. The impedance difference cancelling means cancels or makes the difference of impedance at each photo-sensing area ignorable to unify the charge handling in respective photo-sensing areas. In practice, the impedance difference cancelling means provides a resistance high enough to make the impedance difference between respective photo-sensing areas ignorable.

15 Claims, 3 Drawing Sheets

SOLID STATE IMAGE PICK-UP DEVICE

BACKGROUND OF THE INVENTION

1. Field of the Invention

The present invention relates generally to a solid-state image pick-up device utilizing a charge coupled device (CCD). More specifically, the invention relates to a solid state image pick-up device which can unify the picture quality at every pixcel.

2. Description of the Prior Art

Solid state image sensors comprising a charge transfer device such as a charge coupled device (hereinafter referred to as a CCD) are classified broadly into the frame transfer type and the interline transfer type. Such solid state image sensors comprising the CCD have been given attention as devices able to realize a compact image pick up apparatus, namely, a television camera in miniaturized size operative with low power consumption and with high reliability. However, contrary to the above advantage, previously proposed solid state image sensors comprising the CCD have encountered several problems with the undesirable phenomena called "blooming" and "smear".

Considering the solid state image sensors of the interline transfer type, such a sensing device comprising a sensing and vertical transfer portion including a plurality of photo-sensing areas provided to make horizontal rows and vertical rows. Vertical charge transfer portions are provided along each of the vertical rows of the photo-sensing areas and transfer gate areas provided between each of the photo-sensing areas and the corresponding one of the vertical charge transfer portions. A horizontal charge transfer portion is coupled with the vertical charge transfer portion and an output portion is coupled with the horizontal charge transfer portion. The sensing and vertical transfer portions, horizontal charge transfer portions and output portions are formed on a common semiconductor substrate. The photo-sensing area is provided for producing a signal charge in response to the light received thereby and storing the signal charge therein. The transfer gate area is provided for transferring the signal charge stored in the photo-sensing area to the vertical charge transfer portion at each period corresponding to a vertical blanking period. The vertical charge transfer portion is provided for transferring the signal charge transferred from the photo-sensing area to the horizontal charge transfer portion in order at every period corresponding to a horizontal blanking period. The horizontal charge transfer portion is provided for transferring the signal charge transferred from the vertical charge transfer portion at each one of the periods corresponding to the horizontal blanking periods to the output portion during a period corresponding to a horizontal video period. Further, the output portion is provided for taking out an image pickup signal output in response to the signal charge transferred from the horizontal charge transfer portion.

In solid state image sensors of the interline transfer type using the CCD (hereinafter referred to as interline transfer CCD image sensors) previously proposed, when the light received by the photo-sensing area reaches the semiconductor substrate under the photo-sensing area through the latter and a charge is produced thereby at the semiconductor substrate, such a charge partially flows into the vertical charge transfer portion undesirably without becoming the signal charge and is undesirably transferred by means of the charge transfer operation of the vertical charge transfer portion. This charge undesirably transferred becomes a noise component in the image pickup signal output derived from the sensor which causes an eyesore of a white line on a picture obtained on an image display apparatus such as a picture tube in response to the image pickup signal output. Such phenomenon as to cause the eyesore of white line on the picture is called "smear" and is one of the unsolved problems encountered with the previously proposed interline transfer CCD image sensors.

Smear on the reproduced picture may also occur due to excessive carriers undesirably overflowing to other photo-sensing areas, when high intensity light is irradiated on the photo-sensing area to generate higher charge than the handling charge of the photo-sensing areas. In order to prevent smear on the picture, a so-called "overflow drain" is preferably provided in the image pick-up device.

In the recent years, a "channel stop region" has been used as the overflow drain for the excessive carrier operated in the photo-sensing areas in interline transfer CCD. The CCD structure with the channel stop region has been illustrated at page 39 of "W. F. Kosonocky, in CHARGE-COUPLED DEVICES: TECHNOLOGY AND APPLICATIONS" published by IEEE (Press, June 1972). In the disclosure, the diffusion channel stop region is formed surrounding the sensing and vertical transfer section, in which the photo-sensing areas are arranged in a form of matrix to constitute a photosensitive array. When the excessive carrier is generated, one of the carrier components, e.g. an electron, is drained to a base layer of the semiconductor substrate, which base layer serves as an overflow drain. The other component, e.g. a hole, of the carrier is then transferred to the channel stop region to be drained. However, an impedance difference at respective photo-sensing areas is caused by a difference in the distance between each photo-sensing area and the channel stop region. This differentiates carrier drain characteristics with respect to each photo-sensing area and thereby differentiates handling charge at an individual photo-sensing area, since the bridgeness of the photo-sensing area is determined depending upon the handling charge thereof. Therefore, due to a difference of the handling charge at different positions of the photo-sensing areas, the brightness of a respective pixel on the reproduced image becomes different. This apparently degrades quality of the picture reproduced.

SUMMARY OF THE INVENTION

It is an object of the invention to provide a solid state image pick-up device which has a photo-sensitive array having a substantially uniform handling charge at respective photo-sensing areas.

In order to accomplish the aforementioned and other objects, a solid state image pick-up device, according to the present invention, includes means for cancelling a difference in impedance between photo-sensing areas in a photo-sensitive array. The impedance difference cancelling means cancels or makes the difference of impedance at every photo-sensing areas ignorable to unify the handling charge in respective photo-sensing areas.

In practice, the impedance difference cancelling means provides a resistance high enough to make the impedance difference between respective photo-sensing areas ignorable.

According to one aspect of the invention, a solid state image pick-up device comprises a photo sensing and vertical transferring means including a plurality of photo-sensing elements, each of which photo-sensing elements is designed for receiving light and producing a charge signal corresponding to the amount of the light, horizontal transferring means for receiving the charge signal from the photo elements and vertical transferring means and transferring the charge signal to an output section, means for draining carriers generated in each of the photo-sensing elements of the photo sensing and transferring means, and means for providing a resistance for the draining means, which resistance is high enough in relation to a potential difference between the photo-sensing elements to cancel the potential difference.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiments, but are for explanation and understanding only.

In the drawings.

DESCRIPTION OF THE PREFERRED EMBODIMENT

Figure 1:
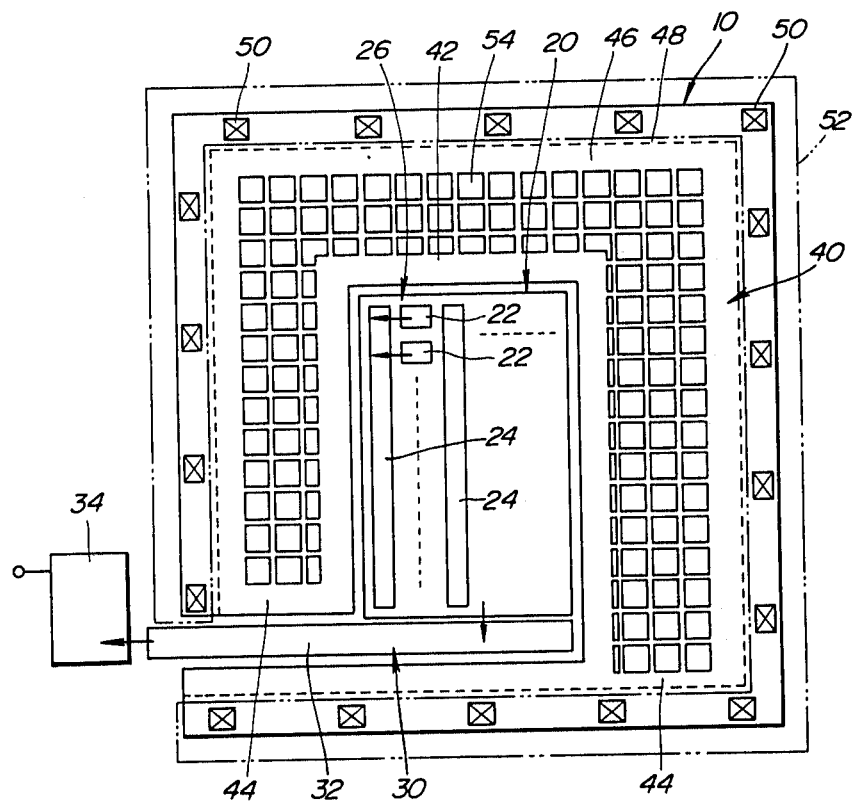
FIG. 1 is a plan view of the preferred embodiment of a solid state image pick-up device according to the invention.

Referring now to the drawings, particularly to FIG. 1, the preferred embodiment of an image pick-up device according to the invention, comprises an interline transfer-type charge-coupled device (CCD). The image pick-up device generally comprises a semiconductor substrate 10, a sensing and vertical transfer section 20 and a horizontal charge transfer section 30. The semiconductor substrate 10 is constituted of a base substrate 12, a first region 14 and a second region 16. In the shown embodiment, the base substrate 12 is formed of an N-type semiconductor. More practically, the base substrate 12 is an N-type silicon substrate. The first region 14 is formed by a P-type layer which is deposited on the N-type silicon substrate. The second region 16 is formed by a P$^-$- type or an N$^-$-type layer and deposited on the first region 14. The first and second regions are deposited on the base substrate 12 by an epitaxial growth. The surface of the second region 16 serves as a primary surface 18 of the semiconductor substrate 10 by selective diffusion or ion implantation.

The sensing and vertical transfer section 20 includes a plurality of photo-sensing areas 22 and vertical shift registers 24. Each of the photo-sensing areas 22 serves as a picture element or pixel for receiving the light to produce and store a signal charge therein. A given number of photo-sensing areas 22 are arranged in a spaced apart relationship to each other and aligned along the associated vertical shift register 24. The vertical shift register 24 receives a signal charge from the associated photo-sensing areas and vertically transfers the signal charge at every period corresponding to the horizontal blanking period. Each of the shift registers 24 and the associated photo-sensing areas 22 constitutes a vertical transfer portion 26. The vertical shift registers 24 are associated with a horizontal shift register 32 in the horizontal charge transfer section 30 to output the signal charge therethrough to an output section 34.

In the shown embodiment, an inner channel stop region 40 are is formed surrounding the aforementioned sensing and vertical transfer section 20. This inner channel stop region 40 is a low impurity concentration region formed by a droping impurity, such as boron B. In the practical implementation, the inner channel stop region 40 is formed by doping boron as an impurity in an order of $10^{12}$ atoms/cm$^3$ by diffusion or ion implantation. The inner channel stop region 40 is connected to an outer channel stop region 42 at both ends thereof through a bridging section 44. The outer channel stop region 42 comprises an inner low impurity concentration region 46 and an outer high impurity concentration region 48. The low impurity concentration region 46 of the outer channel stop region 42 has an identical composition to that of the inner channel stop region 40 and is preferably formed simultaneously with formation of the inner channel stop region. On the other hand, the high impurity concentration region 48 has a higher impurity concentration than that in the inner channel stop region 40. In practice, the high impurity concentration region 48 is formed by doping impurity, such as boron (B), at an order of $10^{14}$ atoms/cm$^2$. The high impurity concentration region 48 is formed in advance of formation of the inner channel stop region 40 and the low impurity concentration region 46. The high impurity concentration region 48 is formed with a plurality of contacting points 50 through which it contacts with A1 wiring 52. These contacting points 50 are supplied with a potential at the ground level or a predetermined level, through the wiring 52. Therefore, the contact points 50 serve as a terminal section.

Between the inner channel stop region 40 at the low impurity concentration region 46 of the outer channel stop region 42, a resistor region 54 is formed. Namely, the resistor region 54 is formed in a space defined by the inner channel stop region 40, the low impurity concentration region 46 and the bridging section 44. In the preferred construction, the resistor region 54 is formed of a meshed structure. By forming the resistor region 54 into the meshed structure, influence of damaging of part of the resistor region 54 can be eliminated or reduced.

Figure 2:
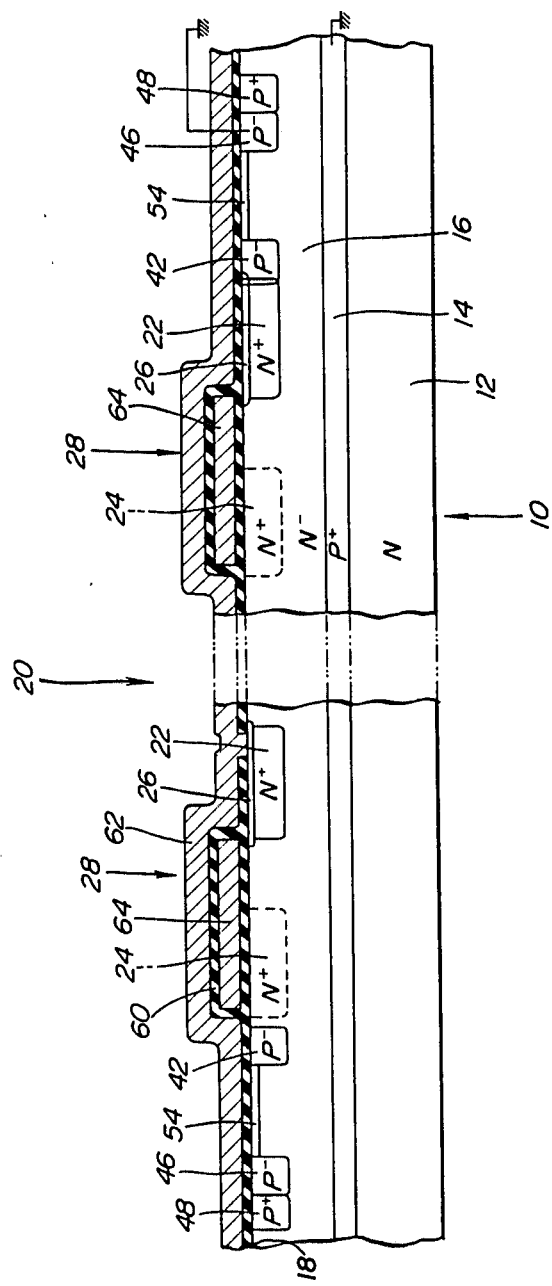
FIG. 2 is a cross-section of the solid state image pick-up device of FIG. 1.

As shown in FIG. 2, in the shown embodiment, the base substrate 12 is formed of an N-type semiconductor substrate. The first region 14 is formed into a P$^+$-type region by doping a P$^+$-type impurity and the second region 16 is formed into an N$^-$-type region by doping an N$^-$-type impurity. Each photo-sensing area 22 is formed in the second region 16 by doping an N$^+$-type impurity by selective diffusion or ion implantation, in a predetermined area and through a given depth in conjunction with the primary surface 18 of the semiconductor substrate 10. The upper surface of each photo-sensing area 22 is covered by mutually separated or independent surface regions 26. The surface regions 26 are electrically conductive. Similarly to the photo-sensing areas 22, each of the surface regions 26 is formed by doping a P$^+$-type impurity by way of selective diffusion or ion implantation, in a predetermined area and to a substantially thin given depth. The surface regions 26 are exposed to the primary surface 18 of the semiconductor substrate 10. Forming the surface region 26 will successfully eliminate noise to be created by influence of defects in the crystal at the surface area of the semiconductor substrate 10.

On the other hand, the shift register 24 comprises a vertical charge transfer region 28 formed on the primary surface 18 of the semiconductor substrate 10. The vertical charge transfer region 28 is also formed by doping an N+-type impurity by way of selective diffusion or ion implantation, similar to the photo-sensing areas 22.

The primary surface 18 of the semiconductor substrate 10 is coated by an insulating layer 60. The insulating layer may comprise a SiO$_2$ layer. A surface electrode 62 is formed over the insulating layer 60. The surface electrode 62 is formed of a transparent material for passing the light. A given fixed potential is applied to the sensing and vertical transfer section 20 through the surface electrode 62.

A plurality of transfer electrodes 64 are provided, to which a two-phase clock voltage for the vertical shift register 24 is applied. The transfer electrodes 64 also serve as transfer gate electrodes for transferring the signal charge of respectively associated photo-sensing areas 22 to the corresponding charge transfer region 28. As seen from FIG. 2, each of the transfer electrodes 64 is disposed within the insulating layer 60 and thus is electrically insulated from the surface electrode 62.

In practice, the surface electrode 62 and the transfer electrodes 64 are formed of a silicon monocrystalline doped impurity to provide low specific contact resistance.

The channel stop regions 40 and 42 are also formed in the second region 16. As will be seen from FIG. 2, the inner channel stop region 40 and the low impurity concentration region 44 of the outer channel stop region 42 are formed by doping a P--type impurity at a low rate. The inner channel stop region 40 adjoins with the adjacent photo-sensing areas 22 and the surface regions 26. The high impurity concentration regions 46 are formed by doping an P-type impurity at a high rate. A P-type region (not shown) is formed through the second region 16 to establish electric communication between the high impurity concentration region 46 and the first region 14 of the semiconductor substrate 10.

In the construction set forth above, a given positive voltage, e.g. 10 V is applied to the base substrate 10 to enable the operation of the image pick-up device. The electrons are is thus generated in each photo-sensing area 22. The amount of the electrons to be generated in the photo-sensing area 22 will be determined corresponding to the amount of the light received. When the amount of the electrons generated in the photo-sensing area 22 exceeds a possible handling charge of the photo-sensing area, and further exceeds the value of an overflow barrier established in the first region 14, the excessive carrier, i.e. the overflow electron is absorbed in the base substrate 12 which serves as an overflow drain. On the other hand, the other carrier, e.g. the hole, is drained through the inner channel stop region 40.

As set forth above, since the inner channel stop region 40 is connected to the terminal section 50 through a high resistance resistor region 54, to be connected to the ground or power supply, the potential at every section of the inner channel stop region 40 becomes substantially uniform. As a result, the distance between each individual photo-sensing area 22 and the inner channel stop region 40 cannot influence the carrier absorbing characteristics of each section of the inner channel region 40. This makes uniforms the depth of the potential well in the photo-sensing areas 22 and the handling charge in respective photo-sensing area.

Figure 3:
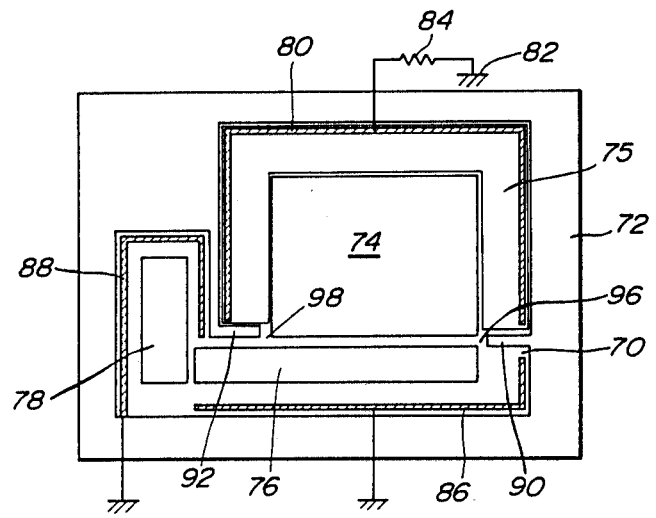
FIG. 3 is a fragmentary plan view of another embodiment of a solid state image pick-up device according to the invention.

FIG. 3 shows another embodiment of the image pick-up device according to the invention. A P+-type region 70 is formed between an a N-type base substrate and N-type surface layer of the N-type semiconductor substrate 72, in a substantially similar manner to that illustrated in FIG. 2. As is well known, the p+-type region 70 is formed by exitaxial growth on the N-type base substrate. A sensing and vertical transfer section 74 is formed on the aforementioned N--type surface layer at the position approximately corresponding to the center of the P+-type region 70. The structure of the sensing and vertical transfer section 74 is substantially the same as that illustrated in FIGS. 1 and 2 and thus is not described in detail in order to avoid redundant recitation. A horizontal shift register 76 is also formed within the well region 70 and located adjacent the aforementioned sensing and vertical transfer section 74. Adjacent one end of the horizontal shift register 76, an output section 78 is formed. The output section 78 is located away from the sensing and vertical transfer section 74. A channel stop region 75 is formed along the boundary of the sensing and vertical transfer section 74. With the construction set forth above, and as discussed with respect to the former embodiment, one component of the carrier, e.g. an electron; is drained to the N-type base substrate via the P+-type region 70 and the other carrier component, e.g. a hole, is drained to the channel stop region 75.

A first grounding wiring 80 is also formed on the N--type surface layer and located in an area corresponding to the P+-type region 70. The grounding wiring 80 is arranged on the channel stop region 75 and connected thereto. The first grounding wiring 80 substantially surrounds the sensing and vertical transfer section 74 leaving one edge of the sensing and vertical transfer section 74 open, which edge opposes the horizontal shift register. The grounding wiring 80 is connected to the ground level 82 through a resistor 84.

A second grounding wiring 86 is further formed on the N--type surface layer adjacent the horizontal shift register 76. As shown in FIG. 3, the second grounding wiring 86 extends substantially along the longer edge at the side remote from the sensing and vertical transfer section 74 and along the shorter edge at the side remote from the output section 78. This second grounding wiring 86 is directly connected to the ground level.

A third grounding wiring 88 is formed on the surface layer of the semiconductor substrate adjacent the output section 78. The third grounding wiring substantially surrounds the output section 78 leaving open an edge portion opposing one edge of the horizontal shift register open. Similarly to the aforementioned second grounding wiring 86, the third grounding wiring is directly connected to the ground level.

As will be seen from FIG. 3, in the shown embodiment, the P+-type region is formed on the semiconductor substrate by providing portions 90 and 92 where the P+-type layer is not deposited and is the base N-type substrate. As seen from FIG. 3, the portion 90 is located between ends of the first and second grounding wirings 80 and 86 to define a high resistance region 96. Also, the portion 92 is located between the first and third grounding wirings 80 and 88 to define therebetween a high resistance region 98. With this construction, respective first, second and third grounding wirings 80, 86 and 88 are separated from each other by the high resistance regions 96 and 98 defined therebetween. Therefore, the potentials at the second and third grounding wirings 86 and 88 which are directly connected to the ground level, will not influence the sensing and vertical transfer section 74.

It should be appreciated that, though the shown embodiment provides the high resistance regions 96 and 98 by providing the portions 90 and 92, it would be possible to form such high resistance regions by reducing the depth of the channel stop region to provide high resistance. Also, it would be possible to form a substantially high resistance region or an insulating region by doping suitable impurity by way of ion implantation in order to reduce conductivity. On the other hand, the resistor 84 can be formed on the semiconductor substrate 72 or can be interposed between the ground level 82 and the grounding wiring 80 as an external accessory.

By providing the high resistance regions and by providing the resistor between the first grounding wiring and the ground level, the potential at the sensing and vertically transfer section is provided at different level compared to the ground level. This isolates the sensing and vertical transfer section from the grounded directly grounding wirings.

With this arrangement, the potential becomes different at respective portions in the sensing and vertical transfer section 74, because of difference of distance to the grounding wiring. However, by providing sufficient impedance which is determined by a combined resistance of the high resistance region and the resistor inserted between the first grounding wiring and the ground level, the potential difference at respective portions in the sensing and vertical transfer section can be relatively small to be ignored. Therefore, by adjusting the resistance in the high resistance region and the resistor, the potential in every portion of the sensing and vertically transfer section can be held uniform. Therefore, handling charge in each of the photo-sensing areas in the sensing and vertical transfer section become substantially uniform.

In practice, the required combined resistance for maintaining the potential at every portion of the sensing and vertical transfer section uniform will be different depending upon the size of the sensing and vertical transfer section, a capacity Cox of the oxide layer of gate electrode, a level of the pulse to be applied to the electrode, and so forth. However, in practice, the combined resistance may be set in a range of 10 to 100Ω.

Figure 4:
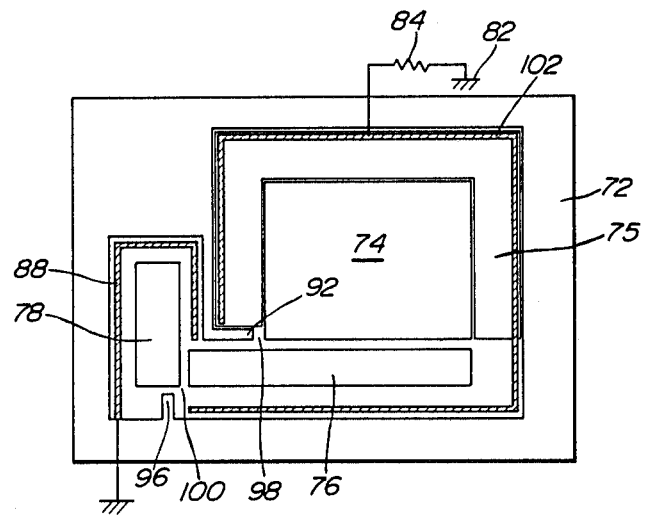
FIG. 4 is a fragmentary plan view of a modification of the solid state image pick-up device of FIG. 3.

FIG. 4 shows a modification of the aforementioned embodiment of the image pick-up device of FIG. 3. In this modification, the first and second grounding wirings in the former embodiment are integrally formed to constitute a single grounding wiring 102. Similarly to the foregoing embodiment, the grounding wiring 102 is connected to the ground level through a resistor 84. This grounding wire 102 is disconnected from the third grounding wiring 88 which is directly connected to the ground level by the portions 92 and 94 defining the high resistance regions 98 and 100.

Even in this modification, the potential at every portion of the sensing and vertical transfer section 74 can be maintained uniform by adjusting the combined resistance of the high resistance regions 98 and 100 and the resistor 84. Therefore, handling charge in each of the photo-sensing areas in the sensing and vertically transfer section 74 becomes substantially uniform.

Therefore, the present invention fulfills all of the objects and advantages sought therefor.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A solid state image pick-up device comprising:
   a photo sensing means including a plurality of photo-sensing elements, each of which photo-sensing elements is designed for receiving light and producing a charge signal corrsponding to the amount of the light;
   charge transferring means for receiving said charge signal from said photo sensing element and transferring said charge signal to an output section;
   means for draining a carrier generated in each of said photo-sensing elements of said photo sensing means and charge transferring means; and
   means for providing a resistance for said draining means, which resistance is high enough in relation to a potential difference between said photo-sensing elements to cancel said potential difference.

2. A solid state image pick-up device as set forth in claim 1, wherein said draining means comprises a channel stop region formed around said photo-sensing means and said transferring means.

3. A solid state image pick-up device as set forth in claim 2, wherein said channel stop region is connected to a wiring connected to a voltage source which applies a given voltage to said wiring.

4. A solid state image pick-up device as set forth in claim 3, wherein said given voltage source applies said given voltage of the ground level to said wiring.

5. A solid state image pick-up device as set forth in claim 3, wherein said channel stop region comprises a first low resistance region and a second first high resistance region.

6. A solid state image pick-up device as set forth in claim 5, wherein said resistance providing means comprises a resistor region formed within said first low resistance region.

7. A solid state image pick-up device as set forth in claim 6, wherein said wiring is connected to said high resistance region.

8. A solid state image pick-up device as set forth in claim 6, wherein said resistor region is formed into a meshed structure.

9. A solid state image pick-up device as set forth in claim 3, wherein said resistance providing means comprises a resistor interposed between said wiring and said voltage source which applies ground level.

10. A solid state image pick-up device as set forth in claim 9, wherein said charge transferring means includes a vertical transferring means for vertically transferring said charge signal of said photo-sensing elements and a horizontal transferring means for receiving said charge signal transferred through said vertical transferring means and horizontally transferring said charge signal to said output section.

11. A solid state image pick-up device as set forth in claim 10, wherein said wiring comprises a first wiring extending around said sensing and vertically transferring means, a second wiring extending around said output section, and a third wiring extending around said horizontal transferring means, said first wiring being connected to said voltage source via said resistor and said second and third wirings being directly connected to the ground.

12. A solid state image pick-up device as set forth in claim 11, which further comprises means for defining a high resistance region between said sensing and vertical transferring means and said horizontal transferring means.

13. A solid state image pick-up device as set forthin claim 12, which further comprises means for defining a high resistance region between said horizontal transferring means and said output section.

14. A solid state image pick-up device as set forth in claim 10, wherein said wiring comprises a first wiring extending around said sensing and vertical transferring means and said horizontal transferring means, and a second wiring extending arround said output section, said first wiring being connected to said voltage source via said resistor and said second wiring being directly connected to the ground.

15. A solid state image pick-up device as set forth in claim 14, which further comprises means for defining a high resistance region between said sensing and vertical transferring means and said output section.

* * * * *